United States Patent [19]

Biehl et al.

[11] Patent Number: 4,551,694
[45] Date of Patent: Nov. 5, 1985

[54] COUPLING ARRANGEMENT FOR A CAVITY RESONATOR

[75] Inventors: Reinhard Biehl, Karlsruhe; Dieter Schmalbein, Marxzell-Burbach; Günther Laukien, Rheinstetten, all of Fed. Rep. of Germany

[73] Assignee: Bruker Analytische Messtechnik GmbH, Rheinstetten-Forchheim, Fed. Rep. of Germany

[21] Appl. No.: 568,728

[22] Filed: Jan. 6, 1984

[30] Foreign Application Priority Data

Jan. 12, 1983 [DE] Fed. Rep. of Germany ....... 3300766

[51] Int. Cl.⁴ .......................... H01P 5/04; H01P 7/06
[52] U.S. Cl. .................................. 333/24 C; 333/230; 333/263
[58] Field of Search .................... 333/202, 206–212, 333/222–235, 263, 24 R, 24 C, 27

[56] References Cited

U.S. PATENT DOCUMENTS

| | | | |
|---|---|---|---|
| 2,395,165 | 2/1946 | Collard | 333/28 R |
| 3,305,799 | 2/1967 | Levin | 333/24 R |
| 3,400,322 | 9/1968 | Habra | 333/230 |
| 3,654,571 | 4/1972 | Rucker et al. | 333/27 |
| 4,051,447 | 9/1977 | Heckman, Jr. | 333/24 R |

*Primary Examiner*—Marvin L. Nussbaum

[57] ABSTRACT

A coupling arrangement for a cavity resonator (10), in particular for measuring the magnetic resonance of a sample (17) located within the cavity resonator (10) comprises a loop (14) for supplying a radio frequency signal to the cavity resonator (10) and exciting in the latter a specific mode of oscillation. For optimizing the coupling of the radio frequency signal, mechanical means are provided, preferably in the form of an axially adjustable screw (16), which permit the surface of the loop (14) to be varied mechanically, and the loop (14) is capacitively coupled with the resonator housing.

11 Claims, 3 Drawing Figures

COUPLING ARRANGEMENT FOR A CAVITY RESONATOR

The present invention starts out from a coupling arrangement for a cavity resonator, in particular for measuring the magnetic resonance of a sample located within the cavity resonator, in which a radio frequency signal is supplied to the cavity resonator and coupled in by means of a loop for exciting an oscillation mode, with means being provided for mechanically adjusting the loop.

A coupling arrangement of this type has been known already from U.S. Pat. No. 4,051,447.

It has been known in analytic measuring techniques to determine the properties of materials by including magnetic dipole transitions in the samples. The methods used for this purpose are designated in a summary manner as Magnetic Resonance Methods and described, for instance, as nuclear magnetic resonance or electron spin resonance methods. In the case of the electron spin resonance method, the sample is simultaneously exposed to an rf magnetic field—usually in the microwave range—and a constant magnetic field, usually in the range of a few Tesla. If a suitable relation exists between the frequency of the rf magnetic field and the intensity of the constant magnetic field, magnetic dipole transitions are generated in the sample which permit conclusions as to the structure of the sample under investigation.

Usually, samples are introduced in this method into a cavity resonator at a point of maximum intensity of the magnetic flux lines H and minimum intensity of the electric flux lines. Now, when the before-described electron spin resonance occurs, this condition is manifested in a variation of the complex susceptibility of the sample which leads in a tuned resonator to a variation of the Q factor and/or the natural frequency due to the fact that the sample changes the complex load on the resonator.

If different samples having a different basic susceptibility are to be measured one after the other, for instance solid bodies on the one hand and liquid samples on the other hand, the resonator must be correspondingly re-tuned as such different samples constitute a very different load on the resonator.

Such re-tuning may be effected for instance by varying the manner in which the rf signal is coupled into the resonator. If, for instance, the rf signal is coupled in via a hollow waveguide and an iris diaphragm, re-tuning of the resonator may be effected by varying the effective iris surface by means of a suitable conductive screw.

However, it has also been known to effect coupling of the resonator by means of a loop arranged to embrace part of the magnetic flux lines in the cavity resonator. If, for instance, a cylindrical cavity resonator of the $H_{011}$ mode is used in which the magnetic flux lines propagate in the axial direction along the resonator axis and the shell surface to close in the radial direction along the end faces of the cylindrical resonator, the loop may be arranged in a resonator cover part to extend along a circular sector or segment at a distance to the resonator axis and into the resonator so as to embrace part of the magnetic flux lines.

However, while it is relatively easy in the case of coupling arrangements using an iris diaphragm of variable cross-section to adapt the arrangement to different samples, this possibility is very limited in the before-described loop arrangements and the arrangement described at the outset using a mechanically adjustable loop because the loop ends on the one hand in a feeding waveguide or coaxial line and is, on the other hand, fixed to the resonator wall.

Starting out from this state of the prior art, the invention has for its object to provide a coupling arrangement for a cavity resonator of the type described before which on the one hand permits coupling by means of a loop and, on the other hand, permits the resonator to be adapted without any problems to a wider range of extremely different loads in the form of samples of different natures.

According to the invention, this objective is achieved in that the loop is capacitively coupled with the resonator housing.

In this manner, the coupling arrangements with loops which have been found to be of advantage for some modes of oscillation and/or resonator types, can be used with advantage, it being simultaneously possible to tune a resonator via the loop alone to different samples which constitute different basic loads on the resonator, in particular when on the one hand solid bodies and on the other hand liquid samples, which represent a much higher load on the resonator, are to be investigated.

In this manner, a more efficient coupling of the resonator to the rf line can be achieved so that the resonator can operate with a higher intensity of the rf magnetic field even with unchanged power of the rf source.

If, according to a further improvement of the invention, this capacitive coupling is also rendered adjustable, the resonator can be perfectly adapted to the feeding rf line so as to minimize the standing wave ratio on the feeding line and, as a result, make the best possible use of the power of the rf source.

It is particularly advantageous in such an arrangement if the mechanical adjustment of the loop and the adjustment of the capacitive coupling can be achieved by common means. This facilitates quite considerably the adaptation of the resonator to different samples and permits to make the best possible use of the rf power available.

When the inductance of the loop and the capacitance of the coupling are varied in the same sense, a broad range of loads on the resonator constituted by different samples can be compensated.

The mechanical adjustment of the loop can be realized in a particularly simple manner by providing a loop holder in which the loop arriving from the feeding rf line ends and which can be adjusted, preferably by means of a screw.

The capacitive coupling is realized in a particularly easy manner if the screw is made of a plastic material, with the loop holder ending in the screw and the screw engaging the metallic cover of the resonator.

The effect of such an arrangement is even improved when the outer thread of the plastic screw and the inner thread of the screw which coacts with the loop holder exhibit different pitchs so that any rotation of the screw will result in a relative movement between the screw and the loop holder which in turn will lead on the one hand to a variation of the capacitive coupling and, on the other hand, to a mechanical adjustment of the loop.

By enclosing the plastic screw by an electrically conductive sleeve which is also adjustably seated in the resonator housing, a further basic adjustment of the coupling arrangement of the invention can be realized so that tuning to an even wider range of different samples becomes possible.

Other advantages of the invention will become apparent from the specification and the attached drawing.

The invention will be described hereafter in detail with reference to the drawings in which FIG. 1 shows a lateral view, partly in cross-section, of a cylindrical cavity resonator using one embodiment of a coupling arrangement in accordance with the invention;

Figure 1:
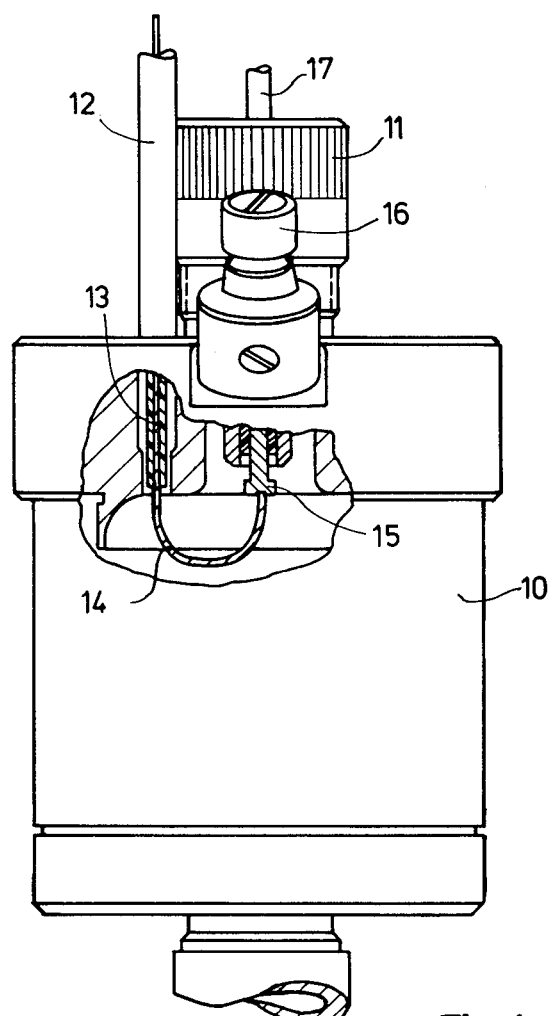

FIG. 1 shows a cylindrical cavity resonator 10 for electron spin resonance measurements. A cover part of the cavity resonator 10 comprises a screw cap 11 by means of which samples 17 can be located in the resonator axis, using a chuck not visible in the drawing. The rf signal is supplied to the resonator 10 via a coaxial line 12 comprising an inner conductor 13. The inner conductor 13 ends in a loop 14 which in turn ends in a loop holder 15. The loop holder 15 can be axially adjusted by means of a screw 16.

In the example shown in FIG. 1, the cavity resonator 10 is excited by a $H_{011}$ mode in which the magnetic flux lines extend along the resonator axis, from there in a radial direction over a cover part, and then in the axial direction near the shell surface of the resonator 10, to return finally to the resonator axis in a radial direction along the other cover part. The sample 17 which is located in the resonator axis is, therefore, situated in the area where a maximum of the magnetic flux lines is encountered. For coupling in the rf signal from the coaxial line 12, the loop 14 is, therefore, arranged in a cover part of the resonator 10 along a circular sector so that it embraces part of the magnetic flux lines of the resonator when the before-mentioned $H_{011}$ mode is used. From a top view of the resonator shown in FIG. 1 it would appear that the feed-in of the coaxial line 12 and the loop holder 15 are both arranged on a common circumferential line.

Figure 2:
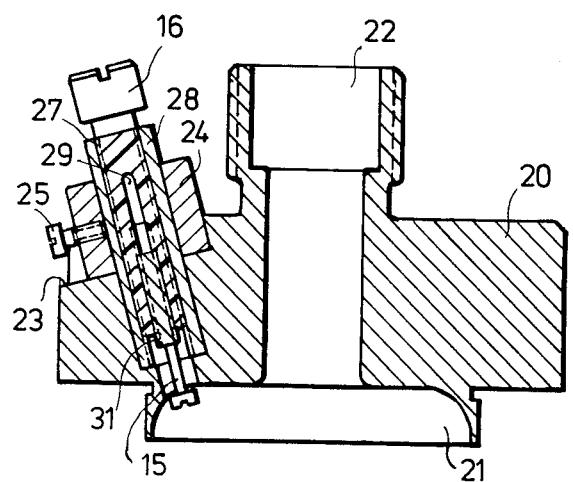
FIG. 2 shows a cross-section through the represented embodiment of the coupling arrangement of the invention, in a direction vertical to the view of FIG. 1.

FIG. 2 shows the coupling arrangement of the invention in detail. The cover part 20 comprises in its bottom portion a resonator cap 21 forming the top face of the resonator. An opening 22 for the samples passes through the cover part 20 and can be closed by the screw cap 11 shown in FIG. 1. A clamping element 24 is fastened, for instance by screwing, on an inclined face milled into the cover part 20. The clamping element 24 is provided with a screw 25 extending vertically to the axis of the clamping element 24. A metallic sleeve 28 fitted with an internal thread 27 is provided to slide along the axis of the clamping element 24. The internal thread 27 coacts with the plastic screw 16 which is in turn provided with an axial blind bore 29 provided with an internal thread 31 which coacts with a matching outer thread of the loop holder 15.

As will be seen in FIG. 2, the plastic screw 16 forms a capacitive coupling between the loop holder 15 and the metallic cover part 20 of the resonator 10. So, a capacitor arrangement with the loop holder 15 as inner and the sleeve 28 as outer electrode and the plastic screw 16 as dielectric will be obtained, depending on the depth of penetration of the threaded section of the loop holder 15 into the plastic screw 16 or the metallic sleeve 28 surrounding the latter.

According to the invention, the two threads 27 and 31 have different pitches, the pitch of the thread 31 being preferably smaller than that of the thread 27. Now, when the plastic screw 26 is turned by means of a suitable instrument, it is displaced relative to the sleeve 28. At the same time, a relative movement is obtained between the loop holder 15 and the sleeve 28 because the loop holder 15 is held at its lower end by the loop 14, which is insofar stationary, to prevent any rotation of the loop holder 15 about its longitudinal axis. Thus, the loop holder 15 is permitted to move only in the axial direction whereby the surface of the loop 14 which enters the interior of the resonator is varied, as can be seen in FIGS. 1 and 2. And since the position of the plastic screw 16 is changed simultaneously, this means that the effective loop surface and the capacitance of the before-described arrangment are varied simultaneously between the loop holder 15 and the sleeve 28. The design of the threads 27 and 31 is selected to ensure that the capacitance varies in the same sense as the inductance of the loop 14.

Figure 3:
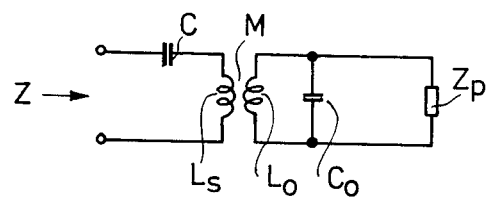
FIG. 3 shows an electric equivalent circuit diagram for the employed coupling arrangement of the invention.

In the equivalent circuit diagram of the arrangement shown in FIG. 3, the effective connected resistance derived from the resonator and the coupling arrangement is designated by Z. The capacitance between the loop holder 15 and the sleeve 28 is designated by C, while $L_s$ symbolizes the inductance of the loop. The cavity resonator 10 is represented by the inductance $L_O$ and the capacitance $C_O$ arranged in parallel thereto. The load in the form of the sample 17 is represented in the equivalent circuit diagram by a complex resistor $Z_p$.

Now, when a sample 17 is replaced by another sample having a different complex resistance $Z_p$, the basic resonance frequency of the resonator will vary so that if correct tuning is to be achieved it is necessary to vary the elements Z and, via the effective loop inductance $L_s$, also the mutual inductance M, M representing the coupling between the loop 14 and the resonator.

When the elements C and $L_s$ are varied in equal sense, tuning occurs in the manner of a resonant input circuit so that the standing wave ratio on the feeding line is minimized and the greatest possible portion of the power of the rf source is permitted to reach the resonator.

Tuning of the resonator using the coupling arrangement of the invention may be effected in two steps. A certain basic tuning may be achieved by displacing the metallic sleeve 28 axially within the clamping element 24 and fixing it thereafter in its new position by means of the screw 25. This step serves substantially to vary the effective surface of the loop 14, i.e. the loop inductance $L_s$. Thereafter, fine tuning may be effected by turning the screw 16, thereby provoking the before-described relative movement between the screw 16 and the loop holder 15 on the one hand and the sleeve 28 on the other hand. Thus, the capacitance C and the inductance $L_s$ are varied simultaneously so that on the whole optimum tuning of the resonator can be achieved by varying the coupling. It goes without saying that the coupling to a cylindrical cavity resonator 10 of the $H_{011}$ mode just described is to be understood only as an example illustrating the invention and that the coupling arrangement of the invention can be suitably varied also for use with other resonator configurations and other oscillation modes.

We claim:

1. A coupling arrangement for coupling a high frequency electrical signal into a cavity resonator through a metallic wall portion thereof by means of a coaxial transmission line having an inner and an outer conductor, the outer conductor being in electrical conductive connection with said metallic wall portion with the inner conductor in spaced electrically insulating relation to the outer conductor, the improvement consisting in that for coupling the high frequency electrical signal into the resonator the inner conductor of the coaxial transmission line is extended for connection, in form of a loop, to a manually adjustable loop holder assembly comprising a threaded electrically conductive sleeve in electrical connection with a wall of the cavity resonator, a screw of dielectric material having first and second threads, the first thread being in engagement with the threads on the sleeve, and a threaded connector element of electrically conductive material the threads of which are threadedly engaged with said second threads on the screw of dielectric material, said extended inner conductor being connected at its free end to said electrically conductive connector element.

2. The coupling arrangement of claim 1, wherein the electrically conductive sleeve is internally threaded and said first and second threads on the screw respectively comprise outer and inner threads, said screw being received in said sleeve with said first screw thread in threaded engagement with the internal thread on the sleeve, said second internal thread on the screw being formed in a centrally inwardly recessed portion of the screw, communicating with the cavity resonator, for receiving within said recessed portion said connector element having external threads in threaded engagement with the internal threads of said recessed portion.

3. The coupling arrangement of claim 2, wherein the first and second threads of said screw have different pitches.

4. The coupling arrangement of claim 2, wherein the loop holder assembly is mechanically adjustable as a whole.

5. The coupling arrangement of claim 3, wherein said screw by means of its first and second threads is independently mechanically rotatable relative to said sleeve and said connector element, said connector element having a fixed connection with said inner conductor and being thus prevented from rotation with said screw whereby said connector element is movable in a direction further into or out of the cavity resonator.

6. The coupling arrangement of claim 4, wherein the sleeve is adjustably held in a clamping element fastened on a wall defining the cavity resonator.

7. The coupling arrangement of claim 1, wherein the loop is located in a cap portion forming the top face of the cavity resonator.

8. The coupling arrangement of claim 7, wherein the cavity resonator is excited in the $H_{011}$ mode and the loop extends in the form of a circular arc around the resonator axis and into the interior of the cavity resonator.

9. The coupling arrangement for coupling a high frequency electrical signal into a cavity resonator through a metallic wall portion thereof by means of a coaxial transmission line having an inner and an outer conductor, the outer conductor being in electrical conductive connection with said metallic wall portion with the inner conductor in spaced electrically insulating relation to the outer conductor, the improvement consisting in that for coupling the high frequency electrical signal into the resonator the inner conductor of the coaxial transmission line is extended for connection, in form of a loop, to manually differentially adjustable means comprising an assembly of at least two spaced metallic electrically conductive, coaxially related, parts and an intermediate rotatable plastic part of electrically non-conductive material in threaded engagement with said metal parts, for differentially adjusting one of said metal parts relative to the plastic part as the latter is rotated relative to said other of said metal parts, the threaded engagement of said plastic part with said two metal parts being by means of different pitch threads.

10. The coupling arrangement of claim 9, wherein said assembly is adjustable as a whole by adjustably positioning said other of said metal parts within an opening in a wall portion of the cavity resonator.

11. A radio frequency coupler for a cavity resonator, comprising a coaxial radio frequency line penetrating a wall portion of said cavity resonator, said coaxial line having an outer conductor connected to a wall portion of the resonator and an inner conductor which extends beyond said outer conductor in form of a coupling loop held at its free end by a loop holder assembly comprising a metallic sleeve, a recessed screw of dielectric material connected to and within the sleeve in coaxial relation thereto, and a metal loop holding element supported by and within the recess of the screw, said loop holding element being provided with a threaded portion, said threaded portion coacting with a first corresponding thread on the coaxial screw which is provided with a second thread which coacts with a corresponding thread of said metallic sleeve which forms part of said cavity resonator wall.

* * * * *